US007648372B2

(12) United States Patent
Wu

(10) Patent No.: US 7,648,372 B2
(45) Date of Patent: Jan. 19, 2010

(54) CABLE ASSEMBLY HAVING CONNECTOR WITH INTERIOR FRAMEWORK

(75) Inventor: Jerry Wu, Irvine, CA (US)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/215,120

(22) Filed: Jun. 24, 2008

(65) Prior Publication Data

US 2009/0318013 A1 Dec. 24, 2009

(51) Int. Cl.
*H01R 12/00* (2006.01)
*H05K 1/00* (2006.01)

(52) U.S. Cl. ........................................ 439/76.1; 439/41

(58) Field of Classification Search ................. 439/610, 439/76.1, 449, 607.47, 607.41, 607.51, 607.05, 439/607.57

See application file for complete search history.

(56) References Cited

U.S. PATENT DOCUMENTS 5,124,888 A * 6/1992 Suzuki et al. ............... 361/740
6,431,901 B1 8/2002 Yeh
7,223,915 B2 5/2007 Hackman

* cited by examiner

*Primary Examiner*—Javaid Nasri
(74) *Attorney, Agent, or Firm*—Wei Te Chung; Andrew C. Cheng; Ming Chieh Chang

(57) ABSTRACT

A cable assembly (1000) includes a connector (1) having an insulated housing (1) and a plurality of contacts (10) received therein; a printed circuit board (2) having a front portion and an opposite rear portion, with the front portion thereof connected to the connector; a cable (4) coupled to the rear portion of the printed circuit board; a framework (3) having at least a retainer (31) and two arms (33, 34) extending rearward from lateral sides of the retainer, said connector held by the retainer and the printed circuit board supported by at least one of the two arms; and a cover enclosing the framework.

7 Claims, 9 Drawing Sheets

CABLE ASSEMBLY HAVING CONNECTOR WITH INTERIOR FRAMEWORK

FIELD OF THE INVENTION

The present invention generally relates to a cable assembly, and more particularly to a cable assembly having an internal framework facilitating manufacturing process.

DESCRIPTION OF PRIOR ART

A printed circuit board, or PCB, is used to mechanically support and electrically connect electronic components using conductive pathways, or traces, etched from copper sheets laminated onto a non-conductive substrate. Alternative names are printed wiring board (PWB), and etched wiring board. A PCB populated with electronic components is a printed circuit assembly (PCA), also known as a printed circuit board assembly (PCBA).

The PCB is also widely applied in an electrical connector, especially in a cable assembly. U.S. Pat. No. 7,223,915 issued to Hackman on May 29, 2007 discloses a cable assembly includes a cable having a number of conductors therein and respectively attached to conductive pads formed on a rear portion of a PCB, a cover of two individual parts enclosing a space for accommodating the PCB therein. The PCB further has a number of conductive traces arranged on front portion thereof as mating interface for mating with a complementary connector. A strain relief member is molded on end portion of the cable and further sandwiched between a retaining member integrated with rear edge of the cover to have the cable secured to the PCB.

U.S. Pat. No. 6,431,901 issued to Yeh on Aug. 13, 2002 introduces an I/O connector includes a top cover, a bottom cover coupling to the top cover, a terminal module positioned between the bottom cover and the top cover and receiving a plurality of terminals therein, and a PCB horizontally soldered to solder portions of the terminals. The I/O connector further includes a strain relief member partially retained within the top and bottom covers and combined with a front portion of the cable which electrically connects to the PCB.

The above-described I/O connector is configured by a plurality of parts rendering a complicate assembling process thus resulting unsatisfactory yield and unwanted cost. Hence, an improved cable assembly is highly desired to overcome the aforementioned problems.

SUMMARY OF THE INVENTION

Accordingly, an object of the present invention is to provide a cable assembly which is easily manufactured.

In order to achieve the object set forth, a cable assembly in accordance with the present invention comprises a connector including an insulated housing and a plurality of contacts received therein; a printed circuit board having a front portion and an opposite rear portion, with the front portion thereof connected to the connector; a cable coupled to the rear portion of the printed circuit board; a framework having at least a retainer and two arms extending rearward from lateral sides of the retainer, said connector held by the retainer and the printed circuit board supported by at least one of the two arms; and a cover enclosing the framework.

Other objects, advantages and novel features of the invention will become more apparent from the following detailed description when taken in conjunction with the accompanying drawings.

DETAILED DESCRIPTION OF PREFERRED EMBODIMENTS

Reference will now be made in detail to the preferred embodiment of the present invention.

Figure 8:
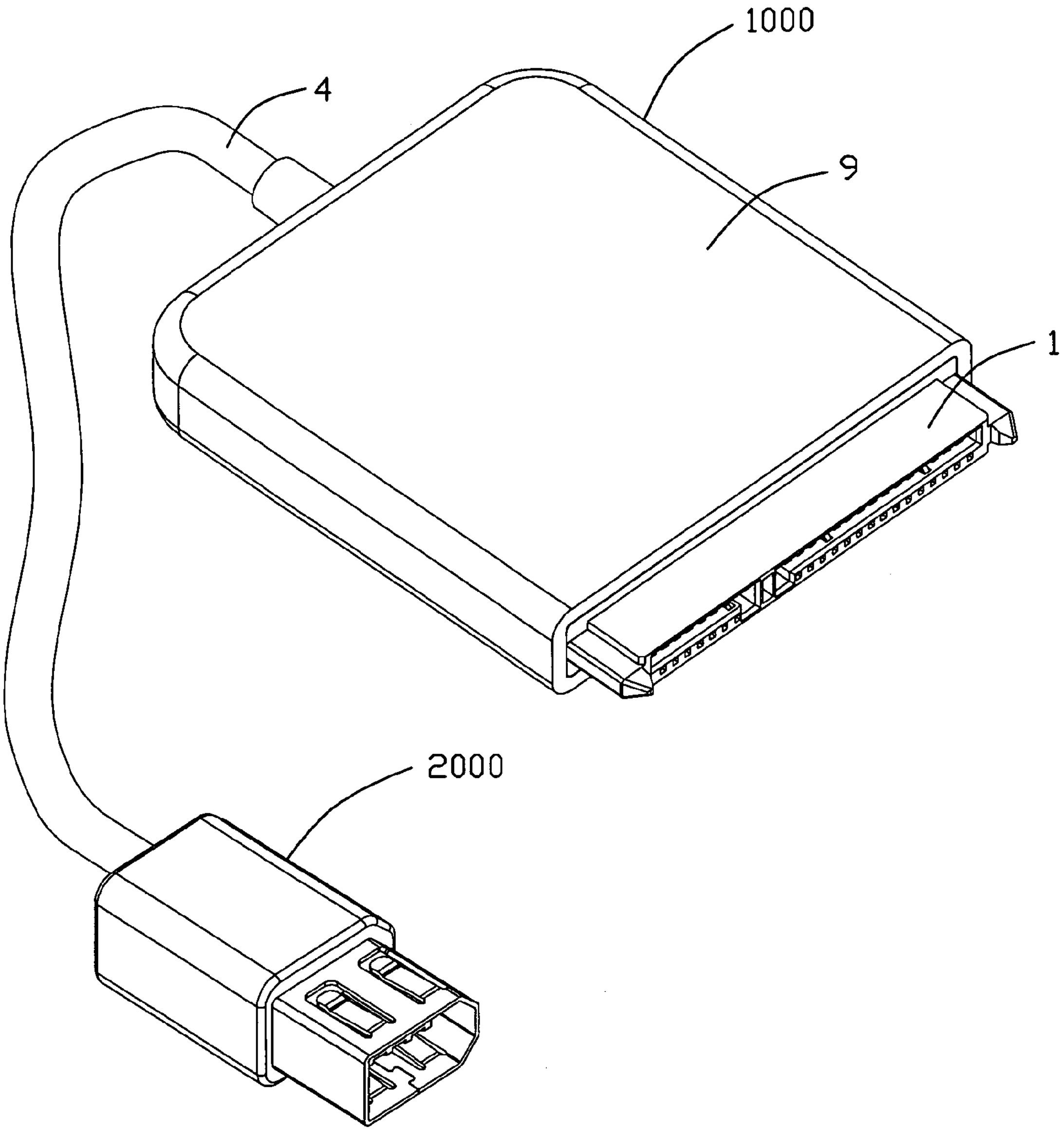
FIG. 8 shows the first connector assembly interconnects with a second connector of a cable assembly in accordance with the present invention.
Figure 9:
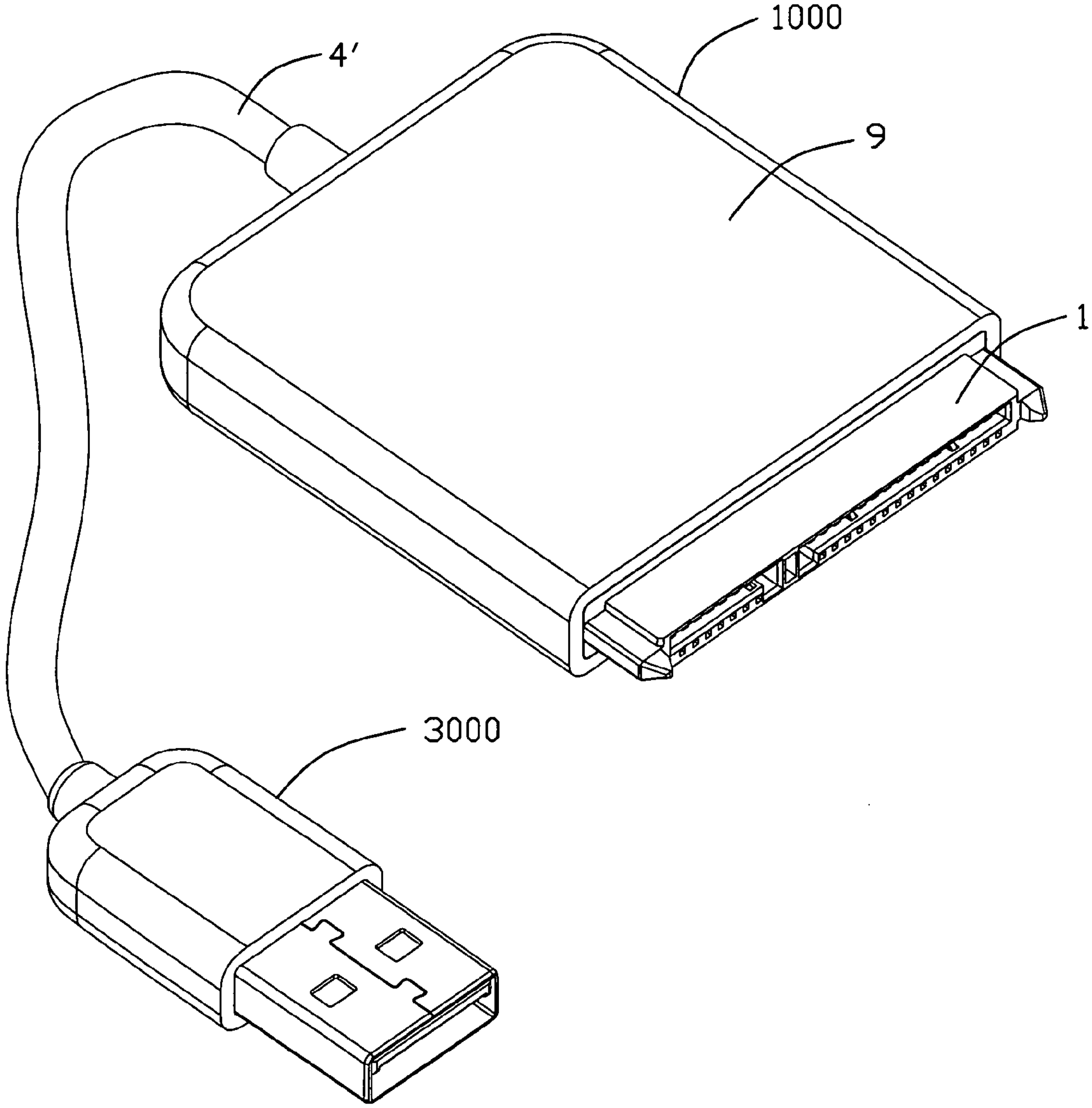
FIG. 9 shows the first connector assembly interconnects with a third connector of a cable assembly in accordance with the present invention.

Referring to FIGS. 8-9, a cable assembly in accordance with the present invention comprises a first connector assembly 1000 optionally interconnects with a second connector 2000 or third connector 3000. In the exemplary embodiment, the first connector assembly 1000 is adapted for Serial Advanced Technology Attachment (SATA) protocol, while the second connector 2000 adapted for IEEE 1394 protocol and the third connector 3000 is adapted for Universal Serial Bus (USB) protocol.

Referring to FIGS. 1-7, the first connector assembly 1000 comprises a first connector 1 with a number of contacts 10 received therein, a printed circuit board (PCB) 2, a framework 3, a cable 4, a strain relief member 5, a grounding member 6 and a cover 7.

The first connector 1 has an elongated insulated housing 100 which has a top wall 11, a bottom wall 12 and a pair of side walls 13, 14 interconnected together to enclose a receiving space (not numbered) therebetween. The receiving space is divided into two chambers 104, 106 by a spacer 103. Both the chambers 104, 106 are L-shaped viewed from a front side. A flange portion 15 is attached to a rear edge of the insulated housing 100 and extends beyond up and low surfaces of the top and bottom walls 11, 12. A pair of arms 16 are integrated with the insulated housing 100 and extend rearward from lateral sides of an upper section of a back side of the flange portion 15. Each arm 16 has a positioning hole 162 in a front section and a position post 164 on a rear section thereof.

The PCB 2 includes a circuit substrate 20, with a set of conductive traces 220 arranged on a front portion 22 thereof, a cutout 241 in a rear portion 24 thereof, a plurality of first conductive holes 240 arranged on the rear portion 24 separated into two groups and symmetrically disposed aside of the cutout 24, and a number of second conductive holes 242 also arranged on the rear portion 24 and disposed outside of the group of first conductive holes 240. A group of grounding pads 246 is disposed on the rear portion 24, in front of the cutout 241. A pair of spaced first holes 222 are defined in opposite corners the front portion 22 and adjacent to a front end the PCB 2. Another pair of spaced second holes 224 are disposed at back of the first holes 222.

The framework 3 comprises a first retainer 31, a second retainer 32 opposite to the first retainer 31 along a longitudinal direction, a pair of lateral arms 33, 34 connected to the first retainer 31 and second retainer 32, respectively. The first and second retainers 31, 32 and the pair of lateral arms 33, 34 corporately encircle a receiving space 30 thereamong. The first retainer 31 is of rectangular-shaped and has a first hollow portion 312 recessed rearward from a front surface thereof. The first hollow portion 312 is in communication to the receiving space 30. A pair of first slots 314, 316 are recessed inwardly from up and bottom surfaces of the first retainer 31. The second retainer 32 is of substantially rectangular-shaped and has a second hollow portion 322 recessed forwardly from a rear surface thereof. The second hollow portion 322 is also in communication to the receiving space 30. A pair of second slots 324, 326 are recessed inwardly from up and bottom surfaces of the second retainer 32. The pair of lateral arms 33, 34 further defines lengthways notches 332, 342 which further communicate with the receiving space 30.

The cable 4 includes a plurality of wires 41, a metallic braiding portion 42 enclosing the wires 40, and a jacket 44 shielding the metallic braiding portion 42. The metallic braiding portion 42 and the jacket 44 of a front portion of the cables 4 are removed away, with the wires 41 exposed outside and separated into two groups, and each group has three individual wires 41.

The grounding member 6 includes a body portion 62 with a passage 60 therein allowing the cable 4 through, a pair of fork-shaped leg portions 64 arranged lateral sides of the body portion 62. The body portion 62 grips the jacket 44 of the cable 4. The metallic braiding portion 42 of the cable 4 is soldered to the body portion 62, while the fork-shaped leg portions 64 clip the PCB 2 and are soldered to the group of grounding pads 246 to form a grounding line. The strain relief member 5 includes a main portion 51 and a pair substantially U-shaped arms 52 extending outwardly from lateral sides of the main portion 51. The main portion 51 is molded over the body portion 62 of the grounding member 6, partial of the metallic braiding portion 42 and sub-cables 40 exposed outside, the jacket 44 adjacent to the grounding member 6.

When assemble, the contacts 10 is inserted into the insulated housing 100 of the first connector 1, with mating portions 101 extending into the receiving space thereof, tail portions 102 disposed outside of a rear surface of the insulated housing 100. Then the front portion of the PCB 2 is disposed on the pair of arms 16 of the first connector 1, with the pair of position posts 164 inserted into the pair of spaced second holes 224, the rear portions 102 of the contacts 10 disposed on the conductive traces 220 of the front portion 22 of PCB 2. A pair of bolts 80 assembled to positioning holes 162 and the pair of first holes 222 to fasten the insulated housing 100 and the PCB 2 together. The tail portions 102 of the contacts 10 are soldered to the conductive traces 220 of the PCB 2.

Secondly, after the grounding member 6 is crimped to the cable 4 and the strain relief member 5 is molded to thereon, then the main portion 51 of the strain relief member 5 partially disposed in the cutout 241 of the PCB 2, the pair of arms 52 clipping the rear portion 24 of the PCB 2. The wires 41 are bent downwardly, inserted into the first conductive holes 240 and soldered therein.

Figure 1:
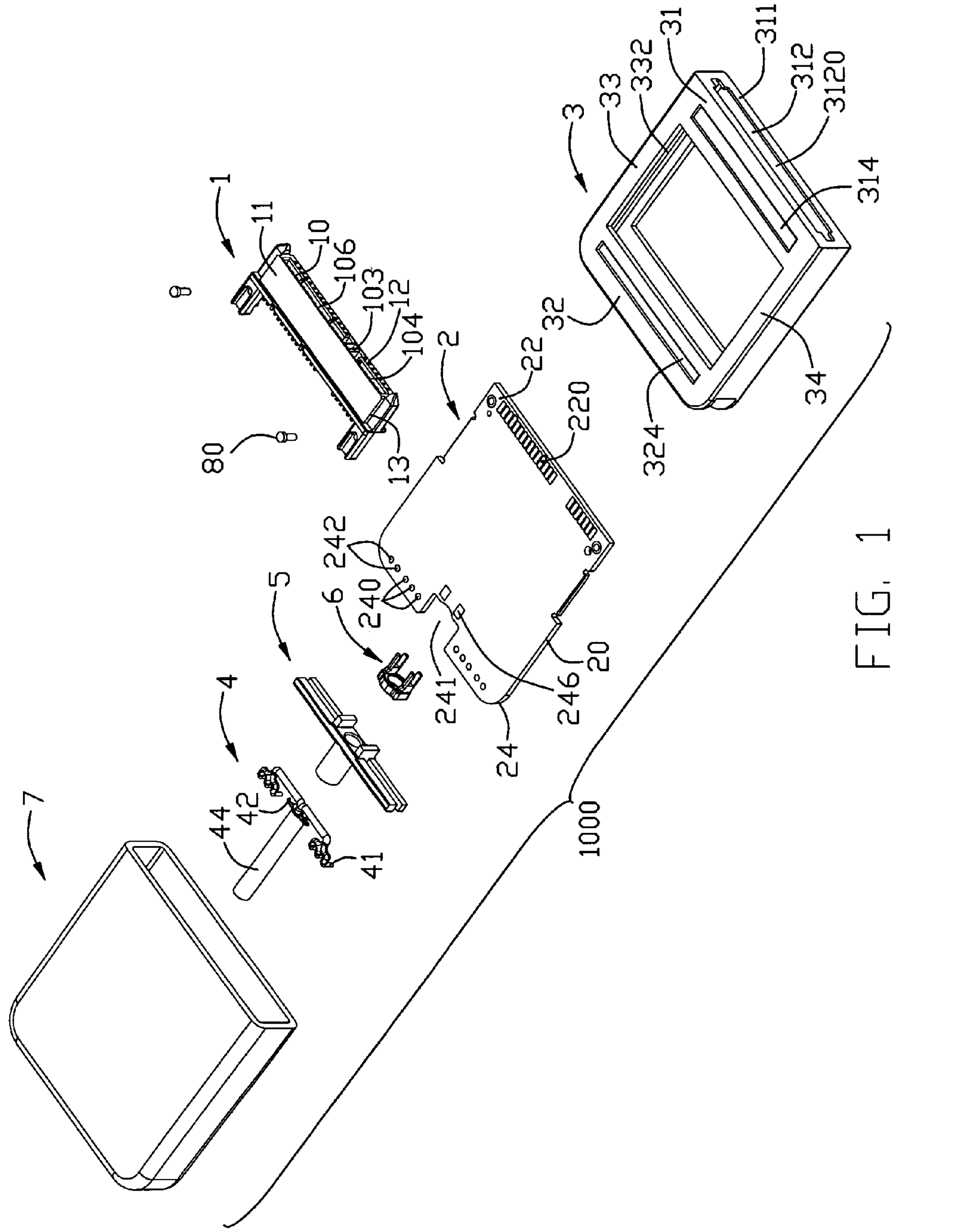
FIG. 1 is an exploded, perspective view of a first connector assembly.
Figure 2:
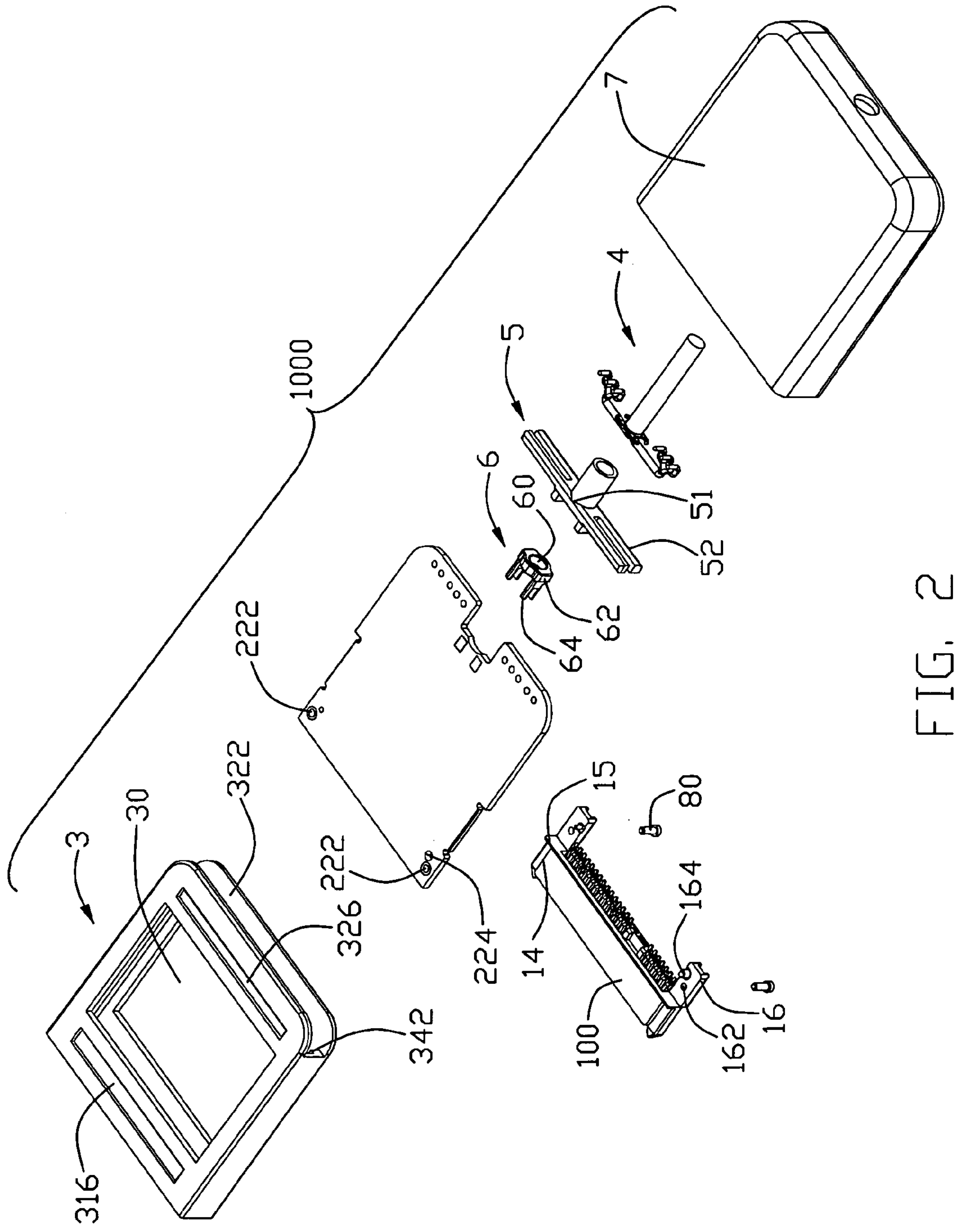
FIG. 2 is similar to FIG. 1, but viewed from another aspect.
Figure 3:
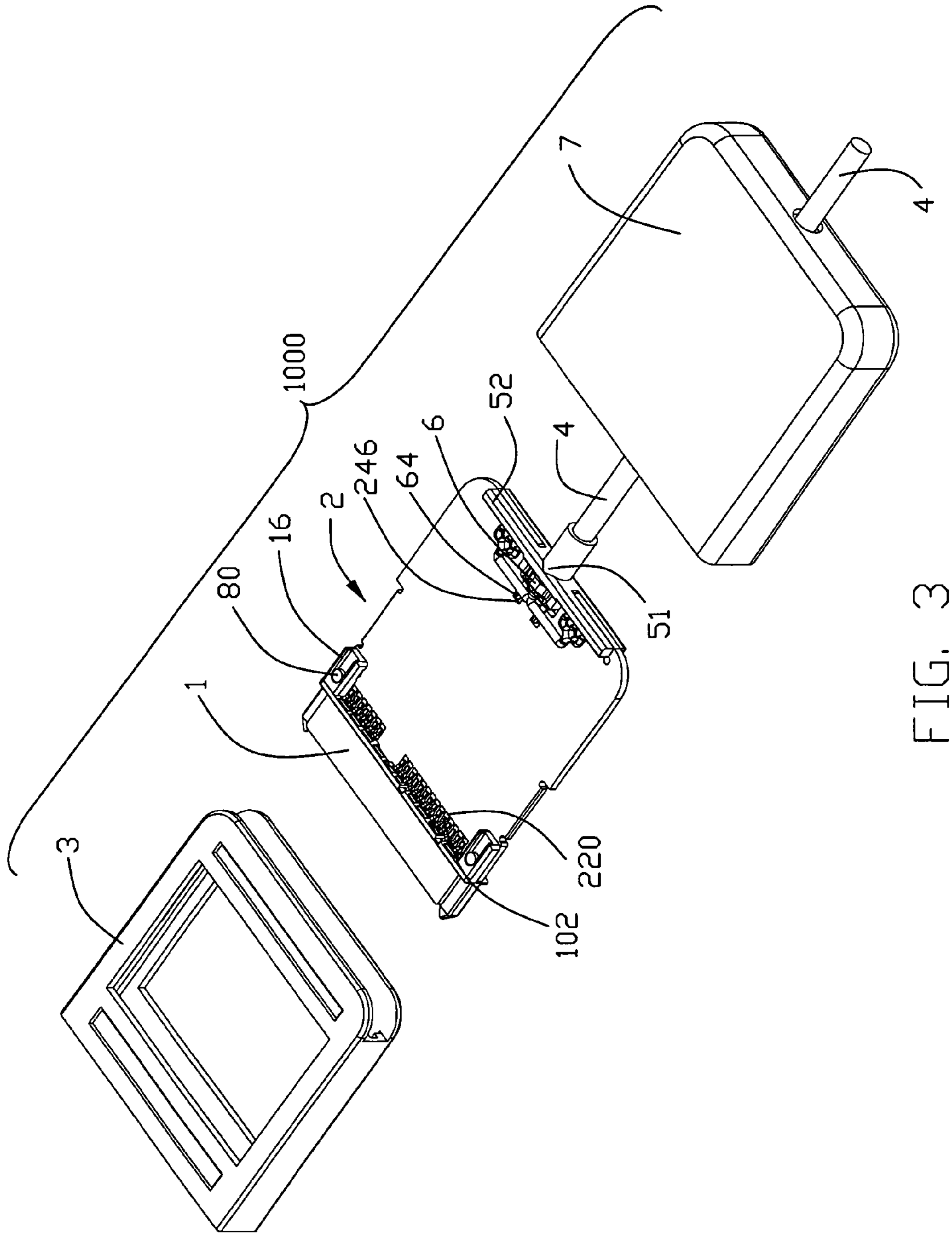
FIG. 3 is a partially assemble view of the first connector assembly.
Figure 4:
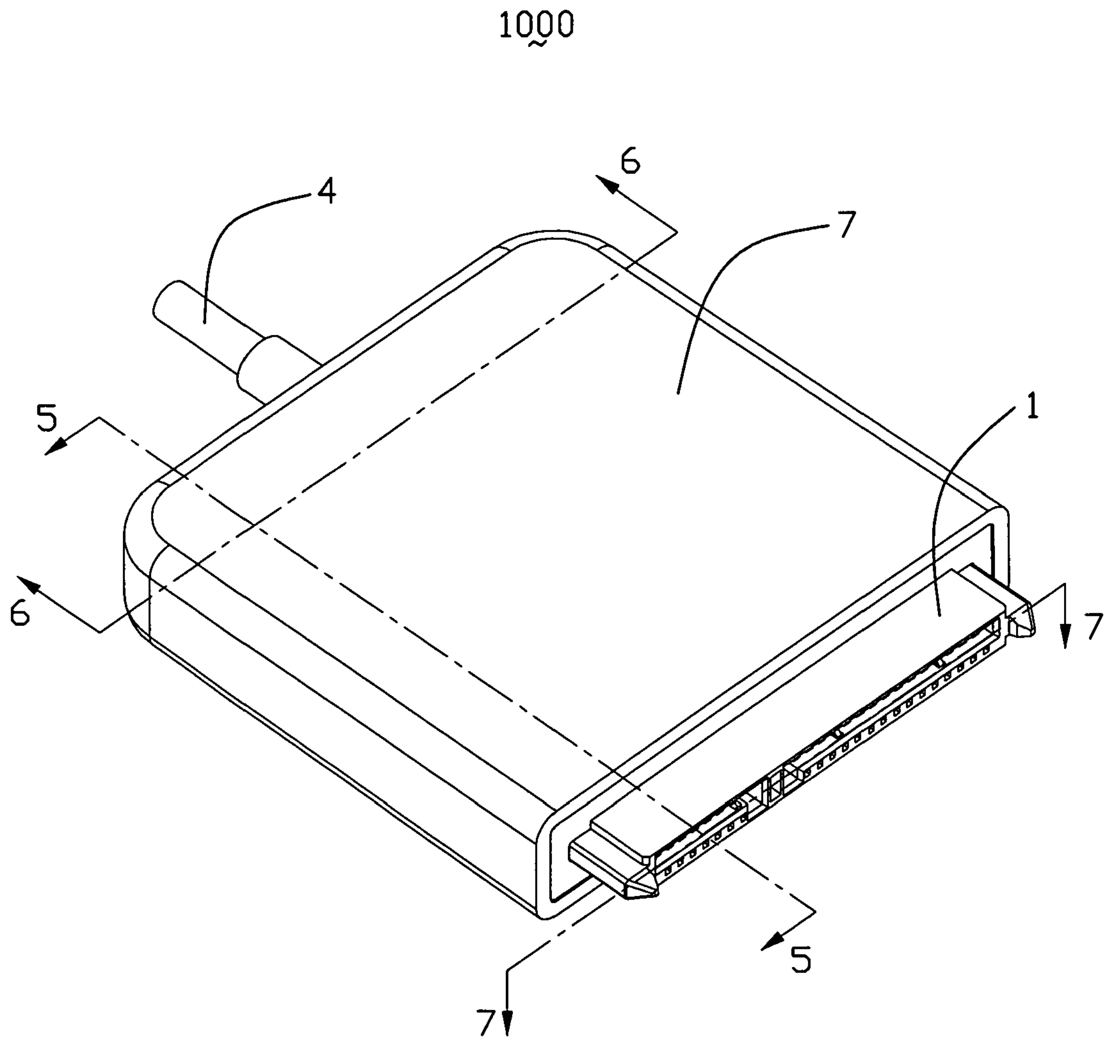
FIG. 4 is an assembled, perspective view of the first connector assembly.
Figure 5:
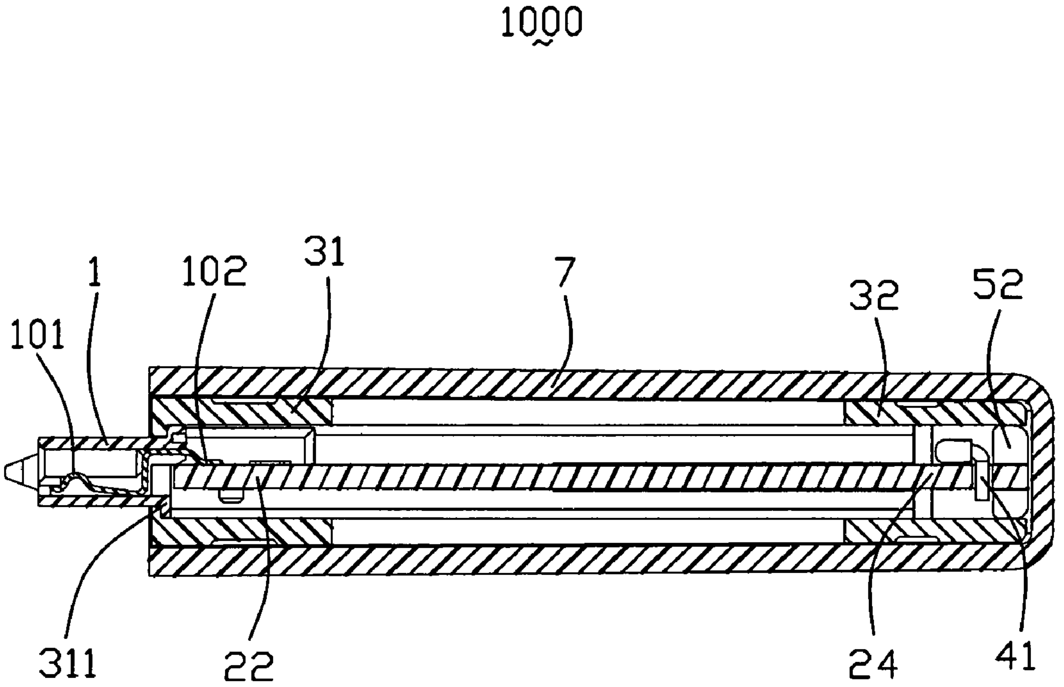
FIG. 5 is a cross-section view taken along line 5-5 of the FIG. 4.
Figure 6:
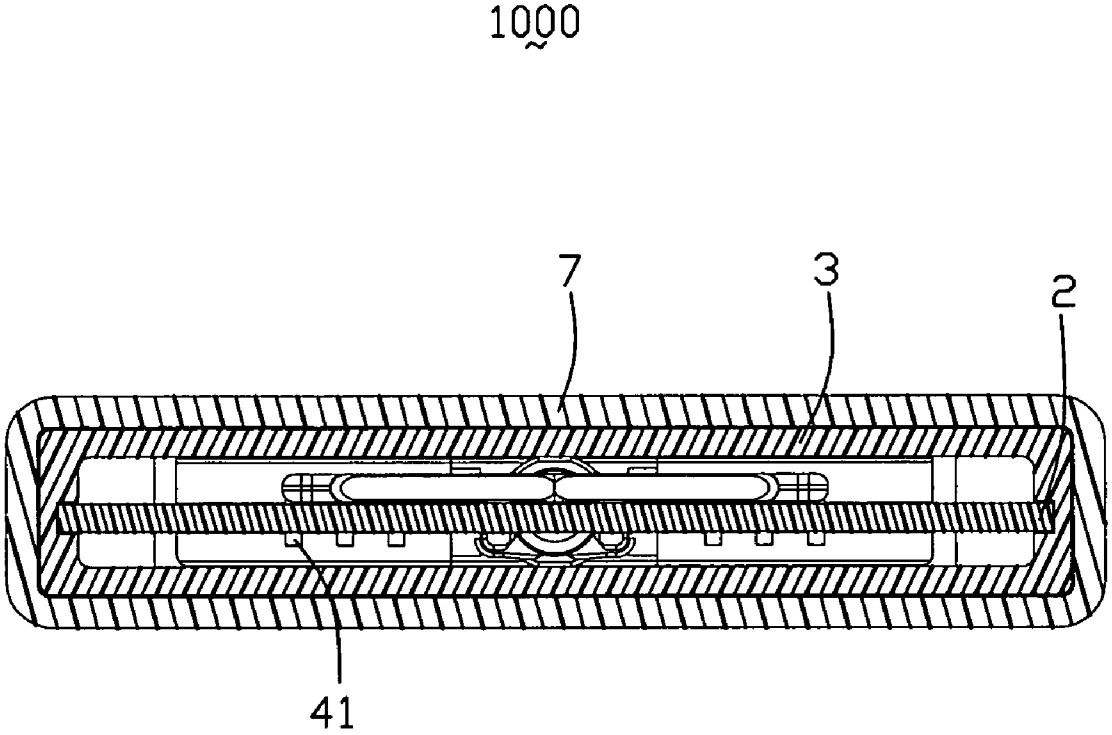
FIG. 6 is a cross-section view taken along line 6-6 of the FIG. 4.
Figure 7:
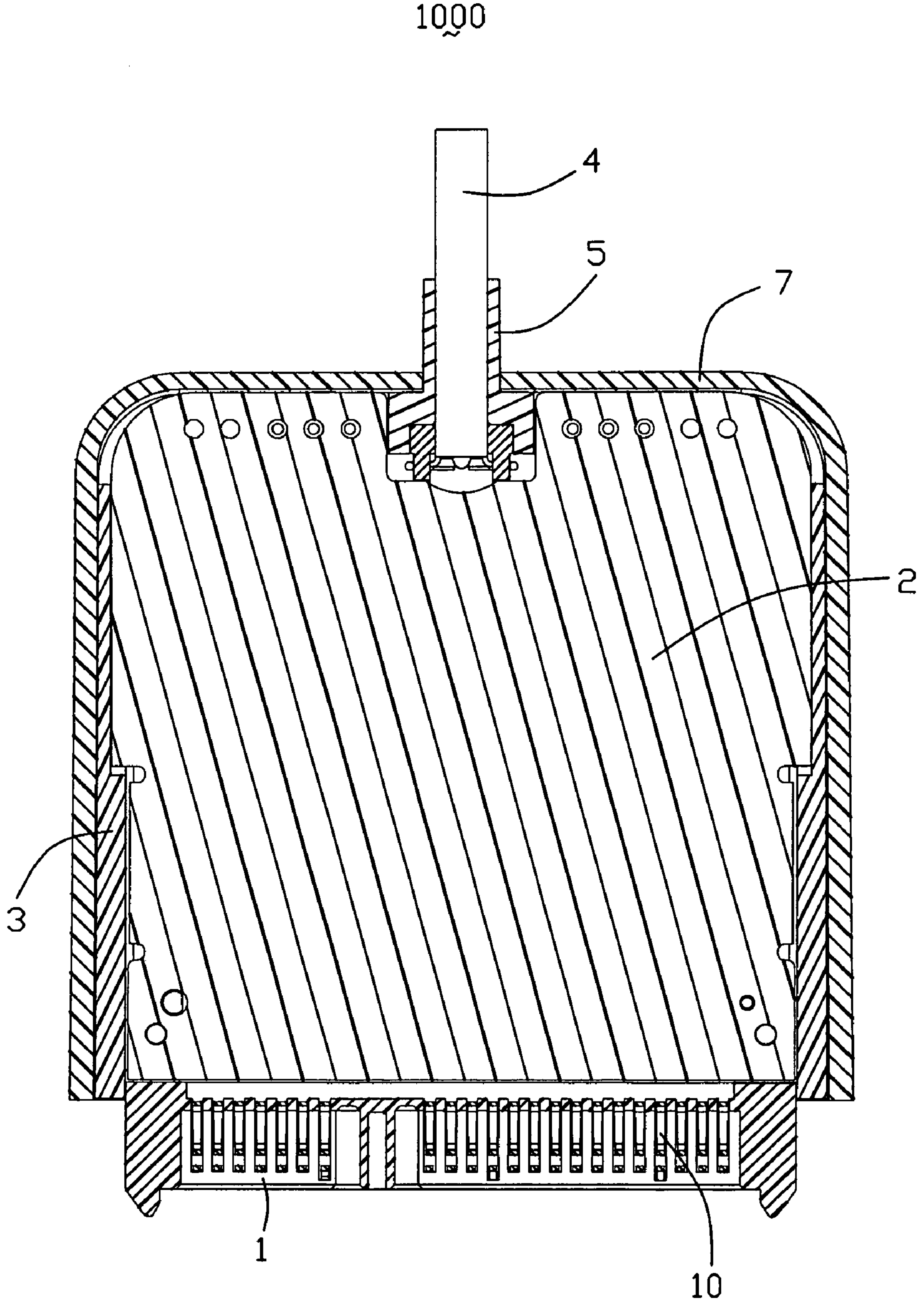
FIG. 7 is a cross-section view taken along line 7-7 of the FIG. 4.

Thirdly, the first connector 1 and the PCB 2 are assembled to the framework 3, with a front section of the insulated housing 100 extending through a front outlet 3120 of the first hollow portion 312, the flange portion 15 of the insulated housing 100 relied against stopper 311 of a front end of the framework 3, the pair of arms 16 and the front portion 22 of the PCB 2 disposed in the first hollow portion 312; a pair of lateral sides of the PCB 2 are received and sandwiched in the notches 332, 342 of the framework 3 (FIG. 6); furthermore, the PCB 2 is sandwiched between the pair of the lateral arms 33, 34 (FIG. 7), the rear portion of the PCB 2, the strain relief member 5 and the grounding member 6 disposed in the second hollow portion 322 and held by the second retainer 32 (FIG. 5). Then glue (not shown) is poured the first slots 314, 316 and second slots 324, 326.

Fourthly, the cover 7 is assembled to the framework 3. Fifthly, the cable 4 is coupled to the second connector 2000.

FIG. 9 illustrates that the first connector assembly 1000 connects to the third connector 3000 via another cable 4'. The cable 4' is similar to the aforementioned cable 4, excepted that only four wires therein and respectively soldered to the second conductive holes 242, and other same structure is omitted hereby.

In the preferred embodiment, the first connector assembly 1000 is alternatively coupled to the second connector 2000 and the third connector 3000 by selecting different conductive pads of the PCB 2, however, more different conductive pads for more connectors is anticipated by the present invention. Furthermore, the PCB 2 can be connected to different connectors, optionally, which may be convenient for producers, and the cost of the production is decreased.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

The invention claimed is:

1. A cable assembly, comprising:

a connector including an insulated housing and a plurality of contacts received therein;

a printed circuit board having a front portion and an opposite rear portion with, the front portion thereof connected to the connector;

a cable coupled to the rear portion of the printed circuit board;

a framework having at least a retainer and two arms extending rearward from lateral sides of the retainer, said connector held by the retainer, and the printed circuit board supported and sandwiched by the two arms; and a cover enclosing the framework; wherein the retainer of the framework has a hollow portion with a front outlet, and said insulated housing extends forwardly through the front outlet; wherein a flange portion is formed at a rear portion of the insulated housing, wherein the framework has a stopper along the front outlet to block the insulated housing sliding out of the framework; wherein a notch is defined in each of the arms of the framework to receive and sandwich a corresponding lateral side of the printed circuit board.

2. The cable assembly as recited in claim 1, wherein the front portion of the printed circuit board is accommodated in the hollow portion of the retainer.

3. The cable assembly as recited in claim 2, wherein the insulated housing has a pair of arms extending rearward from a back surface thereof and fastened to the front portion of the printed circuit board.

4. The cable assembly as recited in claim 1, wherein wires of the cable are inserted into conductive holes in the rear portion of the printed circuit board and soldered therein.

5. A cable assembly, comprising:

a connector including an insulated housing and a plurality of contacts received therein;

a printed circuit board having a front portion and an opposite rear portion, with the front portion thereof connected to the connector;

a cable coupled to the rear portion of the printed circuit board;

a one-piece configured framework having a first retainer, a second retainer opposite to the first retainer, and two arms interconnected to the first retainer and the second retainer, said connector and the front portion of the printed circuit board held by the first retainer, the rear portion of the printer circuit board and the cable held by the second retainer; and a cover shrouding the framework; wherein a receiving space is formed among the first retainer, the second retainer, and the pair of the arms; wherein the first retainer has a first hollow portion communicating with the receiving space, the second retainer has a second hollow portion communicating with the receiving space; wherein the front portion and the rear portion of the printed circuit board respectively extend into the first hollow portion and the second hollow portion; wherein a cutout is defined in the rear portion of the printed circuit board, wherein a number of conductive holes are symmetrically arranged aside the cutout, with wires of the cable inserted therein; wherein a strain relief member has a main portion molded over a front portion of the cable and pair of arms extending outwardly from lateral sides of the main portion; wherein the main portion of the strain relief is disposed in the cutout, and wherein the pair of arms of the stain relief clip the rear portion of the printed circuit board.

6. The cable assembly as recited in claim 5, wherein the cover is a one-piece structure attached to the first retainer and the second retainer of the framework.

7. The cable assembly as recited in claim 6, wherein the first retainer and the second retainer define slots for accommodating glue.

* * * * *